(12) United States Patent
Rastogi et al.

(10) Patent No.: US 9,876,507 B2
(45) Date of Patent: Jan. 23, 2018

(54) SEMANTIC COMPRESSION OF STRUCTURED DATA

(71) Applicant: SAP SE, Walldorf (DE)

(72) Inventors: Ashutosh Rastogi, Walldorf (DE); Anand Sinha, Walldorf (DE)

(73) Assignee: SAP SE, Walldorf (DE)

( * ) Notice: Subject to any disclaimer, the term of this patent is extended or adjusted under 35 U.S.C. 154(b) by 263 days.

(21) Appl. No.: 13/774,953

(22) Filed: Feb. 22, 2013

(65) Prior Publication Data

US 2014/0244602 A1 Aug. 28, 2014

(51) Int. Cl.
*G06F 17/30* (2006.01)
*H03M 7/30* (2006.01)

(52) U.S. Cl.
CPC ........ *H03M 7/30* (2013.01); *G06F 17/30336* (2013.01); *G06F 17/30911* (2013.01)

(58) Field of Classification Search
CPC ........ G06F 17/30336; G06F 17/30911; G03M 7/30
USPC ........................................ 707/693
See application file for complete search history.

(56) References Cited

U.S. PATENT DOCUMENTS

| | | | |
|---|---|---|---|
| 6,130,630 A | 10/2000 | Grohs et al. | |
| 6,330,574 B1 | 12/2001 | Murashita | |
| 6,728,785 B1 | 4/2004 | Jungck | |
| 6,883,137 B1 | 4/2005 | Girardot et al. | |
| 6,961,009 B2 | 11/2005 | McCanne et al. | |
| 7,082,478 B2 | 7/2006 | McCartney et al. | |
| 7,313,634 B1 | 12/2007 | Grinberg | |
| 7,417,570 B2 | 8/2008 | Srinivasan et al. | |
| 8,560,552 B2 | 10/2013 | Fortier | |
| 8,583,829 B2 | 11/2013 | Natchetoi et al. | |
| 2004/0139392 A1* | 7/2004 | Kreiner | H03M 7/30 715/242 |
| 2004/0223649 A1* | 11/2004 | Zacks | G06T 11/00 382/218 |
| 2005/0268341 A1* | 12/2005 | Ross | G06F 21/64 726/26 |
| 2008/0215672 A1 | 9/2008 | Kloba et al. | |
| 2008/0228933 A1* | 9/2008 | Plamondon | 709/230 |
| 2009/0132569 A1* | 5/2009 | Tamiya | 707/101 |
| 2010/0131475 A1* | 5/2010 | Kataoka et al. | 707/693 |
| 2010/0325094 A1 | 12/2010 | Yang et al. | |
| 2011/0099194 A1* | 4/2011 | Trevor | G06F 17/30442 707/769 |
| 2011/0295817 A1* | 12/2011 | Chandrasekar et al. | 707/693 |

(Continued)

OTHER PUBLICATIONS

Bray et al., Extensible Markup Language (XML) 1.0 (Fifth Edition), W3C Recommendation, Nov. 26, 2008, 37 pages.

(Continued)

*Primary Examiner* — Grace Park
*Assistant Examiner* — Jessica N Le
(74) *Attorney, Agent, or Firm* — Brake Hughes Bellermann LLP (57) ABSTRACT

Systems and methods for the semantic compression of structured data include identifying attributes of elements in a collection structure, such as a table. The attributes may be grouped and the grouping used to consolidate attribute values used in the elements. An index of repeated attribute values may also be generated and used to replace the attribute values in elements of the structured data.

15 Claims, 3 Drawing Sheets

(56) References Cited

U.S. PATENT DOCUMENTS

| | | | |
|---|---|---|---|
| 2012/0041931 | A1 | 2/2012 | Ross |
| 2012/0109911 | A1* | 5/2012 | Elzinga .............. G06F 17/2252 707/693 |
| 2012/0218130 | A1* | 8/2012 | Boettcher et al. .............. 341/87 |
| 2013/0103740 | A1* | 4/2013 | Tully .................. H04N 21/251 709/203 |
| 2013/0198342 | A1* | 8/2013 | Xu ......................... H04L 65/60 709/219 |
| 2013/0275478 | A1 | 10/2013 | Bai |
| 2014/0067993 | A1 | 3/2014 | Pannman |
| 2014/0156609 | A1* | 6/2014 | Christian et al. ............. 707/693 |
| 2014/0195500 | A1* | 7/2014 | Amit et al. .................. 707/693 |

OTHER PUBLICATIONS

Cardinality: What it is, and how we use it in agcXML, AGCxml Information Exchange, Jun. 22, 2007, 2 pages.

Data compression, From Wikipedia, the free encyclopedia (en.wikipedia.org/wiki/Data_compression), retrieved on Dec. 17, 2012, 12 pages.

Data model, From Wikipedia, the free encyclopedia (en.wikipedia.org/wiki/Data_model), retrieved on Dec. 18, 2012, 15 pages.

JSON (JavaScript Object Notation) from Wikipedia, the free encyclopedia (en.wikipedia.org/wiki/json), retrieved on Dec. 3, 2013, 10 pages.

Semantic compression, From Wikipedia, the free encyclopedia (en.wikipedia.org/wiki/semantic_compression), retrieved on Dec. 18, 2012, 3 pages.

Semi-structured data, From Wikipedia, the free encyclopedia (en.wikipedia.org/wiki/semi-structured_data), retrieved on Dec. 18, 2012, 2 pages.

Ukelson, J., Structured, Semi-Structured and Unstructured Data in Business Applications (exceedtechnology.com/structured-semi-structured-and-unstructured-data-in-business-applications), Jul. 16, 2007, 3 pages.

XML Attributes, from w3schools.com (www.w3schools.com/xml/xml_attributes.asp), retrieved on Dec. 3, 2012, 3 pages.

XML Elements, from w3schools.com (www.w3schools.com/xml/xml_elements.asp), retrieved on Dec. 3, 2012, 2 pages.

XML Schema (W3C), From Wikipedia, the free encyclopedia, (en.wikipedia.org/wiki/XML_Schema_(W3C)), retrieved on Dec. 3, 2012, 8 pages.

\* cited by examiner

SEMANTIC COMPRESSION OF STRUCTURED DATA

BACKGROUND

With the increased use of computing devices throughout the world, many data networks are reaching their capacities. For example, some cellular phone companies now limit users' data usage within a certain time period (e.g., 3 gigabytes per month). If a user exceeds this limit, the user's download speeds are then slowed by the network throughout the remainder of the time period. One potential method to reduce the amount of data transmitted over a network is data compression. Data compression techniques generally operate to reduce the amount of data needed to convey the same piece of information. For example, a file may be compressed using the ZIP compression technique. However, many compression mechanisms change the format of the original file, requiring a special program to decompress the compressed file. For example, a file having a file extension of ".zip" may only be readable by a program specifically configured to decompress the ZIP format. Thus, new compression techniques often fail to gain industry acceptance due to the lack of users willing to install new decryption software. It is challenging and difficult to devise new compression techniques that leverage existing file formats.

SUMMARY

Implementations of the systems and methods for semantically compressing structured data are described herein. One implementation is a computerized method of semantically compressing structured data. The structured data defines a table that is fully described using text and includes one or more cell elements, each cell element having a set of attribute names and attribute values that define the layout of a table cell. The method includes analyzing the structured data to identify the attribute names and attribute values in the cell elements. The method also includes grouping the attribute names into an ordered set of cell attributes. The method further includes generating an ordered set of attribute values for each of the one or more cell elements, the ordered set of attribute values corresponding to the ordered set of cell attributes in the grouping. The method additionally includes adding the ordered grouping of attribute names to the structured data. The method also includes replacing the attribute names and attribute values of the cell elements in the structured data with the ordered sets of attribute values to generate a compressed version of the structured data. The method further includes providing the compressed version of the structured data to a computing device.

Another implementation is a system for semantically compressing structured data. The system includes a processing circuit configured to store the structured data. The structured data defines a table fully described using text and includes one or more cell elements, each cell element having a set of attribute names and attribute values that define the layout of a table cell. The processing circuit is configured to analyze the structured data to identify the attribute names and attribute values in the cell elements. The processing circuit is also configured to group the attribute names into an ordered set of cell attributes. The processing circuit is further configured to generate an ordered set of attribute values for each of the one or more cell elements, the ordered set of attribute values corresponding to the ordered set of cell attributes in the grouping. The processing circuit is yet further configured to add the ordered grouping of attribute names to the structured data. The processing circuit is also configured to replace the attribute names and attribute values of the cell elements in the structured data with the ordered sets of attribute values to generate a compressed version of the structured data. The processing circuit is further configured to provide the compressed version of the structured data to a computing device.

A further implementation is a computerized method of semantically compressing structured data, the structured data including elements having attribute names and attribute values. The method includes identifying repeated attribute names in the elements. The method also includes generating an index of the repeated attribute names, each entry in the index corresponding to a set of attribute values for the elements. The method further includes including the index in the structured data. The method additionally includes replacing the attribute names and attribute values in the elements with references to the index.

These implementations are mentioned not to limit or define the scope of this disclosure, but to provide examples of implementations to aid in understanding thereof.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Like reference numbers and designations in the various drawings indicate like elements.

DETAILED DESCRIPTION

According to some aspects of the present disclosure, semantic compression may be applied to data stored in a structured data format. In general, structured data refers to any set of data values that includes metadata regarding the relationships between the data values. For example, data values may be hierarchically related and the hierarchy defined using metadata (e.g., "San Francisco" is a child element of "California" according to the metadata hierarchy State>City). Exemplary formats may include, but are not limited to, the Extensible Markup Language (XML) format, the JavaScript Object Notation (JSON) format, and any other format configured to allow the communication of structured data over a network.

The semantic compression techniques described herein are such that the amount of text used in the structured data is reduced, while still maintaining its original information and is still well formed. In other words, an XML file that has been semantically compressed using the described techniques is still an XML formatted file, but uses less text characters. Advantageously, this means that all XML parsers are automatically able to parse the compressed file, without requiring a parser to handle additional formats. Attributes and values may also be compressed dynamically when the structured data is generated and included in the transferred file. For example, the compressed XML file itself may include all of the compressed attributes and values at runtime. This has the additional advantage of not requiring the compressed attributes and values to be re-shared each time the XML format changes (e.g., such as with XSD).

Figure 1:
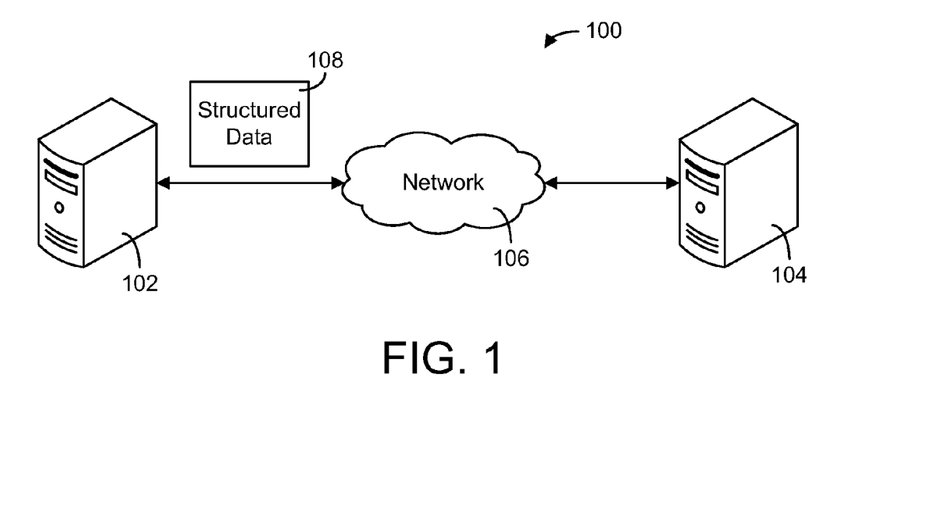
FIG. 1 is a block diagram of a computer system, in accordance with an exemplary embodiment.

Referring to FIG. 1, a block diagram of a computer system 100 is shown, in accordance with an exemplary embodiment. System 100 includes two computing devices 102, 104 which communicate with one another via a network 106. As shown, structured data 108 may be communicated between computing devices 102, 104 via network 106. For example, computing device 104 may transmit one or more text files in XML, JSON, or another structured data format to computing device 102 via network 106, or vice versa.

Computing devices 102, 104 may be of any number of different types of electronic devices configured to communicate via network 106 (e.g., laptop computers, desktop computers, tablet computers, smartphones, web servers, database servers, combinations thereof, or the like). Each of computing devices 102, 104 may include a processing circuit that includes a processor configured to execute machine instructions stored in a memory. Each of the processing circuits may also include interfaces configured to receive or transmit data via network 106, other networks, or user interface devices. A user interface device may be any electronic device that conveys data to a user by generating sensory information (e.g., a visualization on a display, one or more sounds, etc.) and/or converts received sensory information from a user into electronic signals (e.g., a keyboard, a mouse, a pointing device, a touch screen display, a microphone, etc.). The one or more user interface devices may be internal to the housings of computing devices 102, 104 (e.g., built-in displays, microphones, etc.) or external to the housings of computing devices 102, 104 (e.g., a monitor connected to computing device 102, a speaker connected to computing device 104, etc.), according to various implementations. For example, computing device 102 may include an electronic display.

In some embodiments, computing devices 102, 104 may operate in a client-server manner. For example, computing device 102 may operate as a client device that requests data from computing device 104 via network 106. In response, computing device 104 may serve the requested data back to computing device 102 as structured data 108. For example, computing device 104 may be a web server that provides structured data 108 to computing device 102 as part of a requested webpage. In another example, computing device 102 may execute a stand-alone application (e.g., a reporting application, a data management application, an enterprise-level application, etc.) that requests structured data 108 from computing device 104 for use in the application. In other embodiments, computing devices 102, 104 may operate in a peer-to-peer manner in which each of computing devices 102, 104 can act as a client or server. For example, computing devices 102, 104 may be part of a backend system in which either of computing devices 102, 104 may request structured data 108 from the other device.

Network 106 may be any form of data network that relays information between computing devices 102, 104. For example, network 106 may include the Internet and/or other types of data networks, such as a local area network (LAN), a wide area network (WAN), a cellular network, satellite network, etc. Network 106 may also include any number of computing devices (e.g., computer, servers, routers, network switches, etc.) that are configured to receive and/or transmit data within network 106. In other words, network 106 may include other devices configured to relay structured data 108 between computing devices 102, 104. Network 106 may include any number of hardwired and/or wireless connections. For example, computing device 102 may communicate wirelessly (e.g., via WiFi, cellular, radio, etc.) with a transceiver that is hardwired (e.g., via a fiber optic cable, a CAT5 cable, etc.) to other devices in network 106. In addition to computing devices 102, 104, network 106 may be configured to relay data between any number of different computing devices.

Structured data 108 may be one or more text files that include structured data (e.g., files that contain Unicode or other forms of electronic text). Structured data generally refers to any data that conforms to a data model. Such a data model may be formed using metadata to describe the actual data points or their relationships between one another. For example, data stored within a table may have associated metadata corresponding to the name of the row, column, or table where the data is stored (e.g., the value "$455.32" may have associated metadata corresponding to "Sale Amount."). Metadata may also be used to relate the different data points, such as in a hierarchy of data points or between collections of data points (e.g., the sales figure may be associated with a timestamp stored in another table to indicate when the sale took place). In various embodiments, structured data 108 may be fully-structured (e.g., metadata is used to conform all of the actual data points in data 108 to a data model) or semi-structured (e.g., metadata is used to structure only some of the actual data points in data 108). Structured data 108 may also include various text characters to structure its data, such as brackets, parentheses, etc. In some embodiments, structured data 108 includes XML formatted data, JSON formatted data, or text-based data using any other structured or semi-structured format.

According to various embodiments, either or both of computing devices 102, 104 are configured to semantically compress structured data 108 prior to transmittal via network 106. Structured data 108 may be semantically compressed by applying one or more compression techniques to structured data 108. In one embodiment, either or both of computing devices 102, 104 may shorten frequently used tags or attribute names in structured data 108. In further embodiments, structured data 108 may be compressed by not including default attribute values, removing indentations, or flattening the structure by replacing 1-cardinality elements with attributes. In another embodiment, structured data 108 may be compressed by identifying and replacing recurring values in structured data 108. In yet another embodiment, collection structures (e.g., tables or other collections of data) in structured data 108 may be compressed by consolidating common attributes of a collection structure (e.g., attributes regarding the size or location of table cells). As a result of the one or more compression techniques used on structured data 108, structured data 108 may use less text to convey the same underlying information. In turn, this reduces the amount of resources used by network 106 to convey structured data 108 and may also decrease the amount of time needed to communicate structured data 108 between computing devices 102, 104. In some embodiments, structured data 108 may be compressed such that its original syntax and format is maintained (e.g., a compressed XML file is still an XML file). In further embodiments, the semantically compressed version of structured data 108 may be further compressed using another compression technique, such as ZIP compression.

Figure 2:
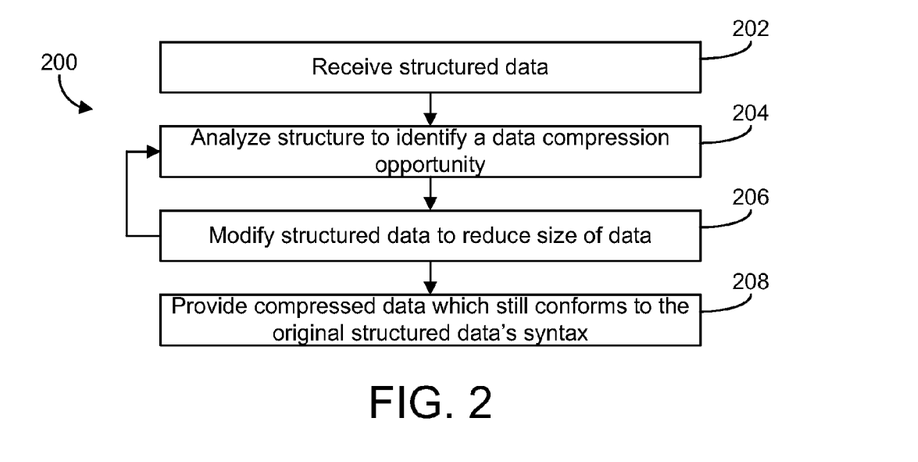
FIG. 2 is a flow diagram of a process for applying compression to structured data, according to an exemplary embodiment.

Referring now to FIG. 2, a flow diagram of a process 200 for applying compression to structured data is shown, according to an exemplary embodiment. Process 200 generally allows for any text-based structured data to be compressed such that the amount of text used for the structured data is reduced. Process 200 may be implemented by one or more computing devices, such as computing devices 102, 104 shown in FIG. 1, executing machine instructions configured to cause the device to perform process 200. The instructions may correspond to a single application that implements process 200 or an application that performs other functions, as well. For example, process 200 may be executed by an application configured to search for data stored in a database and provide retrieved data in a structured format.

Process 200 includes receiving structured data (step 202). The received structured data may be any form of text-based data that includes metadata to provide a structure for other data in the text-based data. Exemplary formats that may be received include, but are not limited to, XML and JSON formatted data. The received data may correspond to a single set of structured data (e.g., a retrieved set of data having a structure, a text file, etc.) or multiple sets of structured data (e.g., multiple text files, multiple sets of interrelated data, etc.). In one embodiment, the received structured data may be received from an application configured to generate the structured data, such as a database interface utility. In other embodiments, the received structure data may be received from any application configured to relay or communicate the structured data via a network. For example, the structured data may be received from a web server application to compress the structured data before transmitting it over a network.

Process 200 includes analyzing the structure of the received data to identify a data compression opportunity (step 204). Data compression opportunities generally correspond to any point in the structured data in which the text may be defaulted, consolidated, rewritten, or otherwise reduced to decrease the amount of text used for the structured data. Exemplary data compression opportunities may include, but are not limited to, 1-cardinality elements in the structured data (e.g., self-contained elements that do not contain any structure), repeated attribute values in the structured data, element or attribute names that can be shortened, indentations in the structured data, recurring values in the structured data, or collection structures (e.g., tables, hierarchies, trees, or other mechanisms to group data) in the structured data.

Process 200 includes modifying the structured data to reduce the size of the data (step 206). In general, the size of the data may be reduced by eliminating characters or spaces used in the text of the structured data. Depending on the type of compression opportunity identified in step 204, a corresponding compression technique may be applied to the structured data to reduce its size. In some cases, steps 204 and 206 may be repeated any number of times to compress the structured data (e.g., a set number of times, until no more compression opportunities are identified, etc.).

In one embodiment, an identified attribute or element name may be shortened. For example, an XML metadata tag "<Store Number= . . . " may be shortened to "<SN= . . . " so that the amount of text is reduced. In various embodiments, a name having over a threshold number of characters may be identified in step 204 and modified in step 206 (e.g., an element or attribute name greater than six characters may be reduced in size). In some cases, a mapping between common names and shortened names may be used to modify the name in the structured data. For example, an element name "Sales Figures" may be mapped to a shortened name "SlsFigs" in a library of common mappings. Whenever "Sales Figures" is identified in step 204, it may be replaced with its corresponding shortened name "SlsFigs."

1-cardinality elements in the structured data may also be flattened. For example, assume that the following XML text exists in the structured data as follows:

```
<style>
    <id>-4</id>
    <bc>a5a5b1</bc>
    <sides>23</sides>
    <halign>2</halign>
</style>
```

In such a case, the element may be "flattened" by including all of its elements as attributes within an empty element tag (e.g., a tag having no corresponding/tag). For example, the above XML text may be replaced as follows:

<style id="-4" bc="a5a5b1" sides="23" halign="2"/> which is an empty element tag, since it is immediately followed by an end tag.

Default attributes may also be removed from the structured data. For example, a Boolean attribute may be defaulted to either "true" or "false" and included in the compressed data only if it has a non-default value. In another example, attributes of type integer or other numerical type (e.g., double, float, etc.) may be defaulted to zero and included in the compressed data only if they have non-zero values. In a further example, empty elements and attributes may be removed from the compressed data.

According to some embodiments, recurring values in the structured data may be identified and placed within their own corresponding tags. In some cases, the most commonly recurring values of a particular type may be set as the default. In one embodiment, a threshold number may be used to determine whether a recurring element is to be compressed. For example, a threshold of ten occurrences may be set and used to determine whether a repeated set of values is to be compressed. The threshold may be hardcoded in the compression utility or may be set via a parameter of the compression utility, in various embodiments. In one example of recurring values, assume that the structured data includes the following XML text:

```
<styles>
<style id="-4" bc="a5a5b1" fc="0b64a0" tc="ffffff" halign="0" />
<style id="-5" bc="a5a5b1" fc="0b64a0" tc="ffffff" halign="2" />
<style id="-6" bc="a5a5b1" fc="0b64a0" tc="ffffff" halign="2" />
</styles>
```

Figure 3:
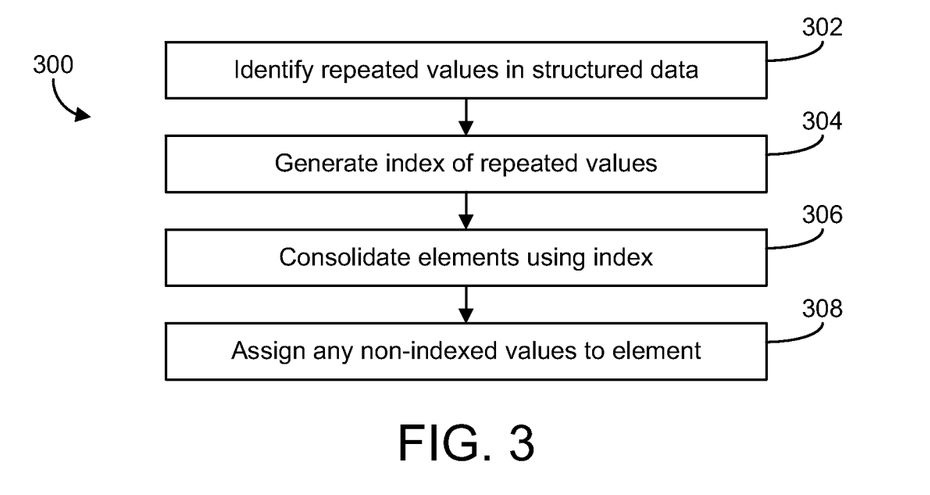
FIG. 3 is a flow diagram of a process for applying compression to repeated elements in structured data, according to an exemplary embodiment.

In such a case, the XML text may be compressed into the following, as shown in greater detail below in process 300:

```
<styles>
<d d4='style' i="0" bc="a5a5b1" fc="0b64a0" tc="ffffff" halign="2"/>
<style id="-4" halign="0"/>
<style id="-5"/>
<style id="-6"/>
</styles>
``` where the repeated values of the styles element have been replaced with tags containing the values. The most frequently repeated values have also been defaulted such that additional text is not used for those styles that use the default values.

Figure 4:
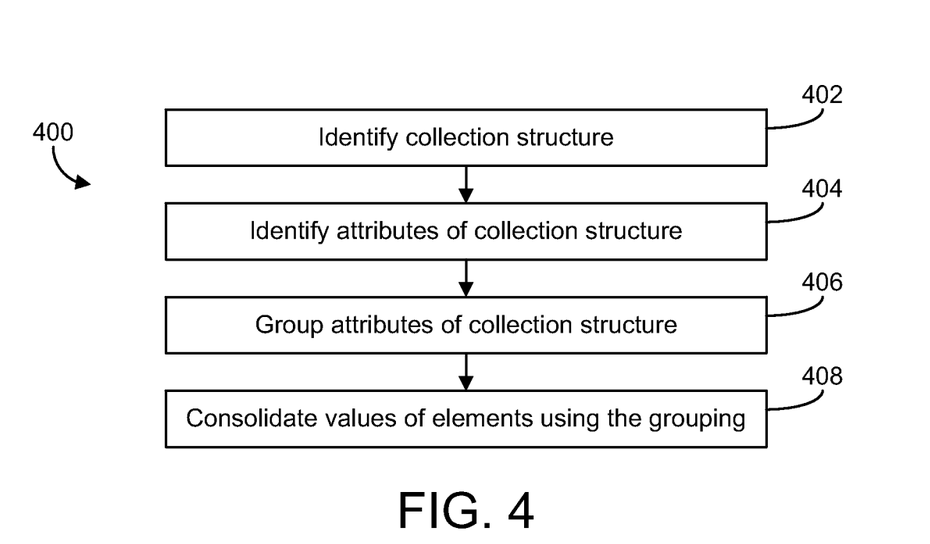
FIG. 4 is a flow diagram of a process for applying compression to a collection structure, according to an exemplary embodiment.

According to further embodiments, a collection structure identified in the received data may be compressed by removing unnecessary attributes from the definition of the collection structure. For example, an XML table structure may be defined in the received data as follows:

```
<table>
<row x="0" y="0" width="100" height="10">
<cell x="0" y="0" width="25" height="10" rowspan="1" colspan="1"
rowindex="1" colindex="1" border="1" align="left"
valign="middle">ZBC </cell>
...
</row>
</table>
``` where the table includes attributes regarding the table's rows and columns. In such a case, the table may be compressed according to the compression technique shown in greater detail in process 400 as follows:

```
<table>
<o a="x,y,w,h,rowspan,colspan,rowindex,colindex,border,align,vAlign"/>
<c a=",,25,10,1,1,1,1,1,L,M">ZBC</c>
...
</table>
``` where the attributes of the table (e.g., x, y, etc.) have been combined and the row tag has been completely eliminated.

Process 200 includes providing the compressed data (step 208). Once the data compression opportunities have been identified and the structured data compressed accordingly, the compressed form of the structured data may be provided. In some embodiments, the compressed data may be provided to another computing device via a network. For example, computing device 104 shown in FIG. 1 may provide compressed structured data 108 to computing device 102 via network 106. In another embodiment, the compressed structured data may be provided to another application executed by the local device. According to various embodiments, the compressed data still maintains its original format or syntax. For example, an XML file compressed using process 200 is still an XML file meaning that many or all XML parsers are able to parse the compressed data. In another embodiment, a compression technique that changes the format of the file may be used in conjunction with process 200. For example, an XML file compressed using process 200 may be further compressed using ZIP compressing before being communicated.

Referring now to FIG. 3, a flow diagram of a process 300 for applying compression to repeated values in structured data is shown, according to an exemplary embodiment. Process 300 generally represents one technique for compressing structured data using a text-based format. Process 300 may be implemented by one or more computing devices, such as computing devices 102, 104 shown in FIG. 1, executing machine instructions configured to cause the device to perform process 200. In various embodiments, process 300 may be implemented in conjunction with process 200 to implement some or all of steps 204, 206 of process 200.

Process 300 includes identifying repeated values in the structured data (step 302). Repeated values may be any repeated string of text in the structured data, such as elements, attributes, or other data values. In various embodiments, repeated values may be semantically compressed such that their underlying data and functionality is not lost. In other words, the reason the values have been repeated may be maintained after the compression. For example, assume that a particular set of webpage styles all use the same font and alignment parameters but differ in terms of color. While the styles have repeated parameters, they are still unique since they differ in color. Thus, any compression of the styles must still reflect the unique set of parameters for each style.

According to various embodiments, different rules may be used to control when compression is applied to repeated values. In one embodiment, compression may only be applied to repeated values that appear more than a threshold amount. The threshold amount may be any number. For example, compression may only be applied to attributes having a value that appears five or more times. In another embodiment, compression may only be applied to a repeated attribute having a value length that is greater than two (e.g., a default tag length plus one extra character). This may ensure that the compression of the repeated values actually decreases the number of text characters in the compressed output. In a further embodiment, repeated elements may only be compressed if they appear consecutively at the same level more than a threshold number of times. For example, elements that appear ten or more times consecutively at the same level may be eligible for compression. In other embodiments, any combination of different rules may be used to control which repeated values are compressed.

In one example of repeated values, assume that the structured data includes the following text in XML format:

```
<styles>
<style id="-4" bc="a5a5b1" fc="0b64a0" tc="ffffff" halign="0" />
<style id="-5" bc="a5a5b1" fc="0b64a0" tc="ffffff" halign="2" />
<style id="-6" bc="a5a5b1" fc="0b64a0" tc="ffffff" halign="2" />
<style id="-7" bc="a5a5b1" fc="0b64a0" tc="ffffff" halign="2" />
<style id="-8" bc="a5a5b1" fc="0b64a0" tc="ffffff" halign="2" />
<style id="-9" bc="a5a5a3" fc="0b64a0" tc="ffffff" halign="0" />
<style id="-10" bc="a5a5a3" fc="0b64a0" tc="ffffff" halign="2" />
<style id="-11" bc="a5a5a3" fc="0b64a0" tc="cccccc" halign="2" />
<style id="-12" bc="a5a5a3" fc="0b64a0" tc="cccccc" halign="2" />
<style id="-13" bc="a5a5a3" fc="0b64a0" tc="cccccc" halign="2" />
</styles>
``` where "<styles>" is an XML tag used to open the "styles" element and "</styles>" is an XML tag used to close the "styles" element. Within the "styles" element are child elements that correspond to the different types of styles. Each child element also has a number of set attributes of the form attribute_name="attribute_value." For example, one attribute of the child elements is "style id" used to differentiate the different styles and having attribute values ranging from −4 to −13. In the above example, the styles elements occur ten times consecutively at the same level. Similarly, these elements have attribute values that appear more than five times. Thus, the above example may be eligible for compression, depending on the compression rules used.

The exemplary XML text above may also be expressed in other formats. In another example, an equivalent set of text in the JSON format is as follows:

```
{"styles":
{"style":[
{"-id":"-4","-bc":"a5a5b1","-fc":"0b64a0","-tc":"ffffff","-halign":"0"},
{"-id":"-5","-bc":"a5a5b1","-fc":"0b64a0","-tc":"ffffff","-halign":"2"},
{"-id":"-6","-bc":"a5a5b1","-fc":"0b64a0","-tc":"ffffff","-halign":"2"},
{"-id":"-7","-bc":"a5a5b1","-fc":"0b64a0","-tc":"ffffff","-halign":"2"},
{"-id":"-8","-bc":"a5a5b1","-fc":"0b64a0","-tc":"ffffff","-halign":"2"},
{"-id":"-9","-bc":"a5a5a3","-fc":"0b64a0","-tc":"ffffff","-halign":"0"},
{"-id":"-10","-bc":"a5a5a3","-fc":"0b64a0","-tc":"ffffff","-halign":"2"},
{"-id":"-11","-bc":"a5a5a3","-fc":"0b64a0","-tc":"cccccc","-halign":"2"},
{"-id":"-12","-bc":"a5a5a3","-fc":"0b64a0","-tc":"cccccc","-halign":"2"},
{"-id":"-13","-bc":"a5a5a3","-fc":"0b64a0","-tc":"cccccc","-halign":"2"}
]
}}
``` where each style has repeated values equivalent to the XML formatted text above. In terms of the number of characters used in each example, the JSON formatted text has 752 characters including spaces and the XML formatted text has 673 characters including spaces.

Process 300 includes generating an index of repeated values (step 304). Once repeated values eligible for compression have been identified, an index may be generated using the most frequently used values. The generated index may have one or more corresponding sets of values (e.g., the index may be a single set of values or may have multiple sets). In one embodiment, single characters may be used first as indices before multiple character indices are used. Doing so helps to reduce the amount of text in the compressed output. For example, one potential set of indices may be {0, 1, 2 . . . }. Alphanumeric or symbolic characters may also be used for indices, to increase the number of single-character indices (e.g., one potential set of indices may follow the order: 0-9, A-Z, !, @, #, etc.). Similarly, any indexed set of repeated values may be represented by an element having a name with a minimal number of characters. For example, repeated values may be stored in the element "d," denoting that the element contains default values.

Referring again to the XML formatted example above, a tag index may be generated as follows:

```
<d d4='style' i="0" bc="a5a5b1" fc="0b64a0" tc="ffffff" halign="2"/>
<d d4='style' i="1" bc="a5a5a3" tc="cccccc"/>
``` where "d" is the name of the indexed elements, "i" is an attribute of the indexed elements having an associated index value (e.g., index 0, index 1, etc.), and each element has attributes corresponding to the identified repeated values. For example, the set of attributes "bc="a5a5b1" fc="0b64a0" tc="ffffff" halign="2"" corresponds to the most frequently repeated set of values in the original text and is assigned to the lowest index. Similarly, the set of attributes "bc="a5a5a3" tc="cccccc"" is the second most frequently used values in the original text and may be assigned to the second index element.

Index elements similar to those in the XML case may also be generated for the JSON example above. For example, the following index elements may be generated:

```
{"styles":
{"d":[
{"-d4":"style","-i":"0","-bc":"a5a5b1","-fc":"0b64a0","-tc":"ffffff","-halign":"2"},
{"-d4":"style","-i":"1","-bc":"a5a5a3","-tc":"cccccc"}],"
...
``` where the index name (e.g., "d") and the indexed values are the same as those used in the XML case. For example, the first indexed set of default values (e.g., index "0") may have the most frequently occurring set of attribute values in the original JSON formatted text.

According to various embodiments, different compression rules may also be used to determine which repeated values are placed in the index. In one embodiment, the set of repeated values having the highest frequency in the structured data may be included in the index. For example, the lowest indexed set of repeated values may correspond to the most frequently used set of values repeated in the structured data. In another embodiment, a threshold percentage may be used to determine whether or not a set of values are to be included in the index. For example, a new entry in the index may be generated only if the corresponding repeated values make up 33% or more of the values for a particular set of elements in the structure data. Unique sets of values (e.g., those that are not repeated) may also be excluded from the index, according to one embodiment. In another embodiment, a new index of repeated values may be generated only for repeated values having more characters than the minimum amount used in the index. In other words, an attribute's name and value may be included in the index provided their combined number of characters exceed a character limit. For example, assuming that a value is one character in size and the name chosen for its corresponding tag index is also one character, a reduction in the amount of text used for the structured data may only be realized if the value has three or more characters. This threshold may also be increased to accommodate longer index names (e.g., an index named "d1" may have a corresponding threshold of four characters before a repeated set of values is included in the index). In another embodiment, optional attributes may be skipped when generating the index of repeated values. For example, assume that the original structured data has elements using attributes A, B, C and optionally D. In such a case, values for A, B, and C may be included in the index, while D is excluded. In further embodiments, any combination of the above compression rules may be used.

Process 300 includes consolidating elements of the structured data using the index (step 306). In some embodiments, the repeated values used to generate the index may be removed from their corresponding elements and replaced with references to the indices of the index. For example, the text of an element containing the default values in index "1" may be reduced by simply referring to index 1. In some embodiments, no reference may be used if the element's values are in the primary default index. In some embodiments, the reference to the index may also reference attributes from different indices. For example, the text of the element may be replaced with "d="bc1"" to use the values in the primary index (e.g., index "0"), but use the value of the "bc" attribute from index "1." Using the previous XML example, the structured data's elements may be consolidated as follows:

```
<style id="-5"/>
...
<style id="-10" d="bc1"/>
<style id="-11" d="bc1, tc1"/>
...
``` where the attributes of style id "−5" have been removed since they correspond to the primary default index "0," the attributes of style id "−10" have been replaced with the attribute "d="bc1"" to signify that its attributes match those in index "0" except for attribute "bc," which takes the value stored in index "1." Similarly, the attributes of style id "−11" have been replaced with the attribute "d="bc1, tc1"" to signify that its "bc" and "tc" attributes have values stored in index "1" and its remaining attributes are stored in index "0." The corresponding JSON elements would be as follows:

```
{"id":"-5"},
...
{"-id":"-10","-d":"bc1"},
{"-id":"-11","-d":"bc1,tc1"},
...
``` where id "−5" uses all of the primary index's values, id "−10" uses all of the primary index's values except for attribute "bc," which uses that of index "1," and id "−11" uses all of the primary index's default values with the exception of attributes "bc" and "tc," which uses the values stored in index "1."

Process 300 includes also assigning any non-indexed values to the elements (step 308). Based on the compression rules used, a particular value may not be included in the index. For example, a value that only appears once or below a threshold amount may not be included in the index. In another example, an optional attribute may be excluded from the index (e.g., an attribute that is not used in every element under analysis). In a further example, an attribute using text characters under a threshold amount may also be excluded from the index. In other words, any left over values after generating the index may be added to the consolidated elements. Referring again to the XML formatted example, one example of a non-indexed value being added to a consolidated element is as follows:

```
<style id="-4" halign="0"/>
``` where "halign="0"" is a non-indexed value (e.g., based on the value appearing only twice in the original structured data). The element has also been consolidated to remove its values included in the index (e.g., the values of its "bc," "fc," and "tc" attributes are stored in the default index "0"). Similarly, a consolidated JSON element may be assigned a non-indexed value as follows:

```
"style":[{"-id":"-4","-halign":"0"}
``` where the non-indexed value of the "halign" attribute is added to the consolidated element.

As a result of process 300, the XML formatted text shown above may be compressed to the following:

```
<styles>
<d d4='style' i="0" bc="a5a5b1" fc="0b64a0" tc="ffffff" halign="2"/>
<d d4='style' i="1" bc="a5a5a3" tc="cccccc"/>
<style id="-4" halign="0"/>
<style id="-5"/>
<style id="-6"/>
<style id="-7"/>
<style id="-8"/>
<style id="-9" d="bc1" halign="0"/>
<style id="-10" d="bc1"/>
<style id="-11" d="bc1,tc1"/>
<style id="-12" d="bc1,tc1"/>
<style id="-13" d="bc1,tc1"/>
</styles>
``` which has a total of 383 characters and is approximately 50% of the size of the original text (e.g., 383/673~50%).

For the JSON example, its original text may be compressed to the following using process 300:

```
{"styles": {"d":[
{"-d4":"style","-i":"0","-bc":"a5a5b1","-fc":"0b64a0","-tc":"ffffff","-halign":"2"},
{"-d4":"style","-i":"1","-bc":"a5a5a3","-tc":"cccccc"}],
"style":[{"-id":"-4","-halign":"0"},
{"-id":"-5"},
{"-id":"-6"},
{"-id":"-7"},
{"-id":"-8"},
{"-id":"-9","-d":"bc1","-halign":"0"},
{"-id":"-10","-d":"bc1"},
{"-id":"-11","-d":"bc1,tc1"},
{"-id":"-12","-d":"bc1,tc1"},
{"-id":"-13","-d":"bc1,tc1"}]}}
``` which has a total number of characters of 398, which is approximately 53% of the original size of the text.

In some embodiments, the compression technique of process 300 may be combined with another compression technique, such as the ZIP compression technique. Preliminary tests combining the compression methodologies of process 300 and the ZIP technique yielded the following:

TABLE 1

| Test No. | Normal Size | Compressed Size | Zipped Size | Compressed and Zipped Size |
|---|---|---|---|---|
| 1. | 10271 | 3099 | 400 | 339 |
| 2. | 20523 | 5953 | 499 | 362 |
| 3. | 41027 | 11659 | 681 | 406 |

As shown, the compression technique of process 300 offers better compression when used in combination with the ZIP compression than if ZIP compression is used alone.

Referring now to FIG. 4, a flow diagram of a process 400 for applying compression to a collection structure is shown, according to an exemplary embodiment. Process 400 represents another compression technique that may be applied to structured data. In various embodiments, process 400 may be used implement some or all of steps 204, 206 of process 200 or may be used in combination with any of the other compression techniques disclosed herein, such as process 300. Process 400 may also be implemented by one or more computing devices, such as computing devices 102, 104 shown in FIG. 1, executing machine instructions configured to cause the device to perform process 400.

Process 400 includes identifying a collection structure in the text of structured data (step 402). In general, a collection structure may be any data structure defined within the structured data. For example, a collection structure may be, but is not limited to, a table, map, graph, hierarchy, queue, tree, or heap. One exemplary XML formatted table may appear as follows:

```
<table>
<row x="0" y="0" width="100" height="10">
<cell x="0" y="0" width="25" height="10" rowspan="1" colspan="1" rowindex="1" colindex="1" border="1" align="left" valign="middle">ZBC </cell>
<cell x="25" y="0" width="25" height="10" rowspan="1" colspan="1" rowindex="1" colindex="2" border="1" align="right" valign="middle"> 10 </cell>
<cell x="50" y="0" width="50" height="10" rowspan="1" colspan="2" rowindex="1" colindex="3" border="1"> Merged </cell>
</row>
</table>
``` which represents a table having a single row having three columns with values "ZBC," "10," and "Merged," respectively. Such a table has 474 characters, including spaces. A corresponding table in JSON format may also appear as follows:

```
{"table":
{"row":{"-x":"0","-y":"0","-width":"100","-height":"10",
"cell":[
{"-x":"0","-y":"0","-width":"25","-height":"10","-rowspan":"1","-colspan":"1","-rowindex":"1","-colindex":"1","-border":"1","-align":"left"," valign":"middle","#text":"ZBC"},
{"-x":"25","-y":"0","-width":"25","-height":"10","-rowspan":"1","-colspan":"1","-rowindex":"1","-colindex":"2","-border":"1","-align":"right","-valign":"middle","#text":"10"},
{"-x":"50","-y":"0","-width":"50","-height":"10","-rowspan":"1","-colspan":"2","-rowindex":"1","-colindex":"3","-border":"1","#text":"Merged"}]}}}
``` which includes the same data as the XML-based table and has 572 characters.

Process 400 includes analyzing the format of the collection structure to identify attributes of the collection structure (step 404). Depending on the type of collection structure, different metadata attributes may be used to define the structure of the collection. In some embodiments, for example, a table may include attributes regarding the starting coordinate of a cell (e.g., x and y coordinates), width and height attributes (e.g., measured in pixels or percentages), a rowspan attribute (e.g., a cell that spans across a number of cells in a column), a column span attribute (e.g., a cell that spans across a number of cells in a row), a row index attribute (e.g., an index of the starting row), a column index attribute (e.g., an index of the starting column), or alignment attributes for the horizontal and vertical alignments of the content of the table's cells. In further examples, a collection structure may have Boolean attributes (e.g., true or false attributes), color-related attributes (e.g., attributes regarding the background color, font color, etc. of the collection), numeric attributes (e.g., floating point, integer, or other numeric attributes such as phone numbers, zip codes, etc.) or enumerations.

Process 400 includes grouping the attributes of the collection structure (step 406). In one embodiment, the attributes may be assigned to a particular ordering of attributes. For example, a table's attributes may be represented in the following order: x, y, w, h, rowspan, colspan, row index, colindex, border, align, Valign. The ordered group of attributes may also be assigned an element name or attribute name. In some embodiments, names used for the attribute grouping may be selected to be minimal (e.g., a single character name such as "o"). For example, the attributes of the XML formatted table shown above may be grouped as follows:

<o a="x,y,w,h,rowspan,colspan,rowindex,colindex,border,align,vAlign"/> where "o" is the name of the grouping element and "a" is the name of the attribute grouping the table's attributes. Similarly, the attributes of the JSON formatted table may be grouped as follows:

{"table":{"o":{"-a":"x,y,w,h,rowspan,colspan,rowindex,colindex,border,align,vAlign"}, where "o" is also used as the name of the element grouping the table's attributes and the grouped set of attributes is assigned the name "a." In contrast to the repeated values of process 300, each element of a collection structure may have the same set of attributes (e.g., each cell of a table may have attributes regarding its location, width, height, etc.). Thus, a threshold number of repetitions may or may not be used to determine whether the attributes are grouped, according to various embodiments.

Process 400 includes using the grouping of collection structure attributes to consolidate the values in its elements (step 408). Once the collection structure's attributes have been grouped, the text of its elements may be consolidated using the grouping. In one embodiment, the name of each element may be shortened. For example, each element named "cell" in a table may be renamed to be "c." The various attributes in a collection structure's elements may also be replaced with a single attribute with values corresponding to the grouping. The values in the attribute may also be delimited (e.g., using a comma or other delimiter). Where a value is not used in a particular element, it may be represented as consecutive delimiters, in one embodiment. For example, the XML table shown above may be compressed as follows:

```
<table>
<o a="x,y,w,h,rowspan,colspan,rowindex,colindex,border,align,vAlign"/>
```

```
<c a=",,25,10,1,1,1,1,1,L,M">ZBC</c>
<c a="25,,25,10,1,1,1,2,1,R,M">10</c>
<c a="50,,50,10,1,2,1,3,1,,">Merged</c>
</table>
``` where each cell entry in the row has a single attribute "a" that corresponds to the grouped set of table attributes. Values in the "a" attribute are also comma-separated. In cases in which a table attribute is not set for a particular element, two commas may be used. For example, the third cell may not have horizontal or vertical alignment attributes in the original text. Similarly, the JSON table shown above may be compressed as follows:

```
{"table":
{"o": { "-a": "x,y,w,h,rowspan,colspan,rowindex,colindex,border,align,vAlign"},
"c":[{"-a":",,25,10,1,1,1,1,1,L,M","#text":"ZBC"},
{"-a":"25,,25,10,1,1,1,2,1,R,M","#text":"10"},
{"-a":"50,,50,10,1,2,1,3,1,,","#text":"Merged"}]}}
``` where each cell element is assigned an attribute containing delimited values corresponding to the grouping of table attributes. As a result of the compression by process 400, the XML formatted text is reduced to 203 characters (e.g., approximately 42.8% of its original size) and the JSON formatted text is reduced to 235 characters (e.g., approximately 41% of its original size).

Similar to process 300, the compression techniques of process 400 may be combined with another compression format, such as ZIP. Preliminary tests using the compression technique of process 400 and the ZIP format are as follows:

TABLE 2

| S. No | Normal Size | Compressed Size | Zipped Size | Compressed & Zipped Size |
|---|---|---|---|---|
| 1. | 8201 | 3749 | 520 | 295 |
| 2. | 16385 | 7403 | 606 | 322 |
| 3. | 24567 | 11057 | 686 | 348 |
| 4. | 32751 | 14711 | 761 | 371 |

Accordingly, the compression technique of process 400 may be used with ZIP compression to achieve an even greater amount of compression.

Figure 5:
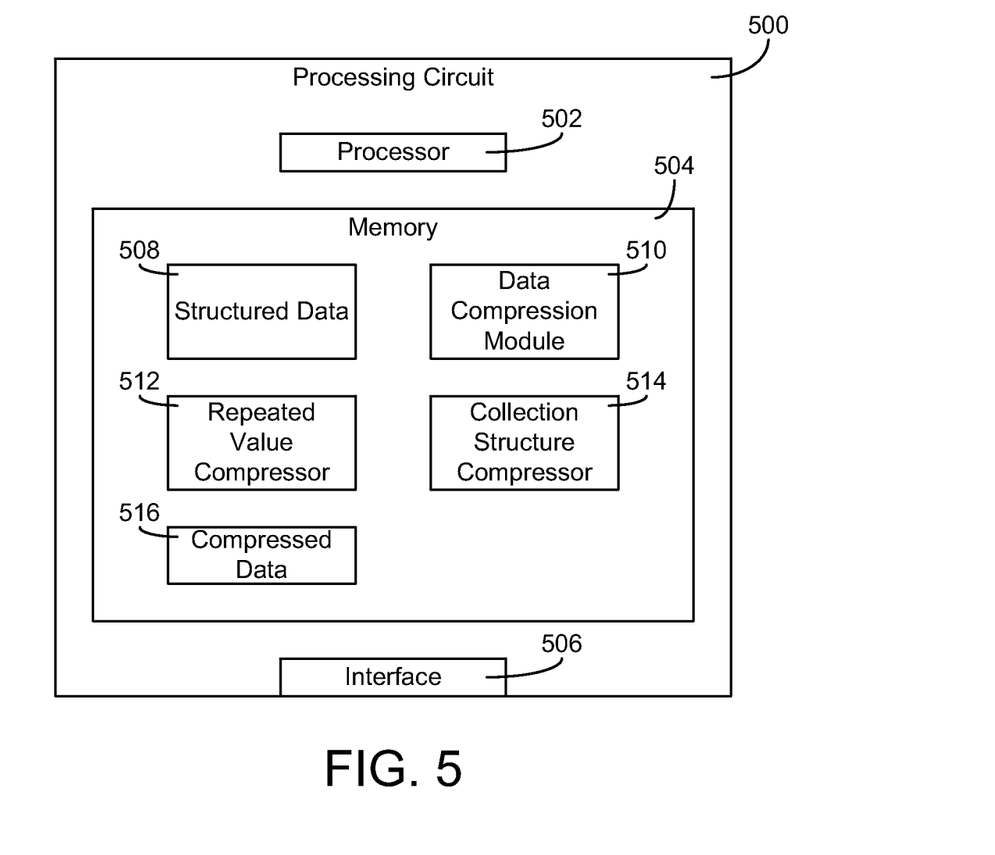
FIG. 5 is a schematic block diagram of a processing circuit configured to apply compression to structured data, according to an exemplary implementation.

Referring now to FIG. 5, a schematic block diagram of a processing circuit 500 configured to compress structured data is shown, according to an exemplary embodiment. Processing circuit 500 may be a component of a collaboration service or another device that facilitates collaboration across reports. Processing circuit 500 includes a memory 504 and processor 502. Processor 502 may be, or may include, one or more microprocessors, application specific integrated circuits (ASICs), circuits containing one or more processing components, a group of distributed processing components, circuitry for supporting a microprocessor, or other hardware configured for processing. According to an exemplary embodiment, processor 502 is configured to execute computer code stored in memory 504 to complete and facilitate the activities described herein. Memory 504 can be any volatile or non-volatile computer-readable storage medium capable of storing data or computer code relating to the activities described herein. For example, memory 504 is shown to include modules 510-514 which are computer code modules (e.g., executable code, object code, source code, script code, machine code, etc.) configured for execution by processor 502. According to some embodiments, processing circuit 500 may represent a collection of processing devices (e.g., servers, data centers, etc.). In such cases, processor 502 represents the collective processors of the devices and memory 504 represents the collective storage devices of the devices. When executed by processor 502, processing circuit 500 is configured to complete the activities described herein.

Processing circuit 500 includes hardware circuitry for supporting the execution of the computer code of modules 510-514. For example, processing circuit 500 is shown to include one or more hardware interfaces 506. Hardware interface 506 may include hardware to receive data from a network or serial BUS and to communicate data to another processing circuit via a network or serial BUS. Hardware interface 506 may be configured to receive or transmit data wirelessly (e.g., via radio signals, via infrared signals, etc.) or over a hardwired connection (e.g., a CAT5 cable, a fiber optic cable, etc.). For example, hardware interface 506 may receive structured data 508 from another computing device for compression. Hardware interface 506 may also communicate data to other devices, such as compressed data 516.

Structured data 508 may be any form of text-based data having a structure. The structured data may include, for example, metadata regarding the structure of underlying data values stored in structured data 508. For example, structured data 508 may include metadata regarding its types of underlying data values (e.g., structured data 508 may include metadata that identifies certain data values as being "sales figures") or the relationships between the underlying data values (e.g., the values are hierarchically related, the values are part of a collection structure, etc.). Structured data 508 may be generated locally in memory 504 by another application or may be received via interface 506 from a remote computing device. For example, processing circuit 500 may be part of a web server that receives structured data 508 from a database access service. In response, processing circuit 500 may compress structured data 508 into compressed data 516 and provide compressed data 516 to a client device. In various embodiments, structured data 508 may be formatted using XLM, JSON, or any other text-based format.

Memory 504 includes data compression module 510 which is configured to compress structured data 508 into compressed data 516. Data compression module 510 generally operates by parsing structured data 508, identifying compression opportunities, and modifying structured data 508 to reduce its amount of text to generate compressed data 516. Data compression module 510 may use any combination of the compression techniques described herein. In one embodiment, data compression module 510 may use repeated value compressor 512 to identify and consolidate repeated values in structured data 508. In another embodiment, data compression module 510 may use collection structure compressor 514 to compress a table or other collection structure in data 508. Data compression module 510 may also remove default attribute values or indentations from structured data 508 or may flatten the structure of structured data 508 by replacing 1-cardinality elements with attributes. In further embodiments, data compression module 510 may utilize a compression technique that changes the file type of structured data 508. For example, data compression module 510 may also apply ZIP compression or another such compression format after compressing structured data 508.

Memory 504 may include repeated value compressor 512 which is configured to identify and consolidate repeated values in structured data 508. In one embodiment, repeated value compressor 512 may implement process 300 to generate an index of values repeated in structured data 508. For example, the most frequently used set of values in structured data 508 may be assigned to an index by repeated value compressor 512. Repeated value compressor 512 may also replace elements in structured data 508 having repeated values with references to the generated index, or to nothing in the case where the element uses the most frequently used set of values. In various embodiments, repeated value compressor 512 may use parameters that control its operation. Such parameters may include, but are not limited to, parameters that set thresholds regarding the number of consecutively repeated elements in structured data 508 having the same level, the number of characters used by the values, the number of times the values are repeated, or a frequency of how often the values appear in the total set. Such threshold parameters may be used by repeated value compressor 512 to control which repeated values in structured data 508 are added to the index and removed from their corresponding elements.

Memory 504 may also include collection structure compressor 514. In one embodiment, collection structure compressor 514 may implement process 400 to group attributes of the collection structure. For example, collection structure compressor 514 may group attributes regarding a table cell's width, height, position, row span, column span, etc., into a single attribute. Collection structure compressor 514 may include an element for this grouping in compressed data 516. Elements of the collection structure (e.g., cells of a table, nodes of a graph, etc.) may be compressed by collection structure compressor 514 by replacing their corresponding attributes in the grouping with a reference to the grouping and delimited values for the collection structure attributes. Similar to repeated value compressor 512, collection structure compressor 514 may include parameters that control how the collection structure's attributes are grouped (e.g., which character is used to delimit their values in the compressed elements, how the new attributes and elements are named, etc.).

Once compressed data 516 has been generated, processing circuit 500 may provide compressed data 516 to another application or computing device. For example, compressed data 516 may be provided to another computing device via interface 506, in response to a request being received for the data. In another example, compressed data 516 may be provided to another device (e.g., a web server, an application server, etc.) configured to transmit compressed data 516 over a network. As a result, the amount of network resources is reduced, as well as the total transmission time needed to communicate compressed data 516 over the network. According to various embodiments, compressed data 516 is well formed and retains the same format and syntax used in structured data 508. For example, an XML formatted set of data in structured data 508 may be compressed by data compression module 510 into corresponding XML formatted data in compressed data 516. Thus, compressed data 516 may be read by existing applications on any number of devices and without requiring the installation of new software on the devices.

Implementations of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on one or more computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium may be tangible.

The operations described in this specification can be implemented as operations performed by a data processing apparatus on data stored on one or more computer-readable storage devices or received from other sources.

The term "client or "server" include all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), LCD (liquid crystal display), OLED (organic light emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending webpages to a web browser on a user's client device in response to requests received from the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The features disclosed herein may be implemented on a smart television module (or connected television module, hybrid television module, etc.), which may include a processing circuit configured to integrate Internet connectivity with more traditional television programming sources (e.g., received via cable, satellite, over-the-air, or other signals). The smart television module may be physically incorporated into a television set or may include a separate device such as a set-top box, Blu-ray or other digital media player, game console, hotel television system, and other companion device. A smart television module may be configured to allow viewers to search and find videos, movies, photos and other content on the web, on a local cable TV channel, on a satellite TV channel, or stored on a local hard drive. A set-top box (STB) or set-top unit (STU) may include an information appliance device that may contain a tuner and connect to a television set and an external source of signal, turning the signal into content which is then displayed on the television screen or other display device. A smart television module may be configured to provide a home screen or top level screen including icons for a plurality of different applications, such as a web browser and a plurality of streaming media services, a connected cable or satellite media source, other web "channels", etc. The smart television module may further be configured to provide an electronic programming guide to the user. A companion application to the smart television module may be operable on a mobile computing device to provide additional information about available programs to a user, to allow the user to control the smart television module, etc. In alternate embodiments, the features may be implemented on a laptop computer or other personal computer, a smartphone, other mobile phone, handheld computer, a tablet PC, or other computing device.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product embodied on a tangible medium or packaged into multiple such software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

What is claimed is:

1. A computerized method of semantically compressing structured data, the structured data defining a table, wherein the table is fully described using text and includes one or more cell elements, each cell element having a set of attribute names and attribute values that define the layout of a table cell and the structured data further comprises elements outside of the table having attribute names and attribute values, the method comprising:
analyzing the structured data to identify the attribute names and attribute values in the cell elements;
grouping the attribute names into an ordered set of cell attributes and assigning a name to the ordered set of cell attributes;
generating an ordered set of attribute values for each of the one or more cell elements, wherein the ordered set of attribute values includes a single attribute and the attribute values and corresponds to the ordered set of cell attributes in the grouping having the assigned name;
adding the ordered grouping of attribute names having the assigned name to the structured data;
replacing the attribute names and attribute values of the cell elements in the structured data with the ordered sets of attribute values that includes the single attribute and the attribute values to generate a compressed version of the structured data;
identifying repeated attribute names in the elements outside of the table;
generating an index of the repeated attribute names, each entry in the index corresponding to a set of attribute values for the elements outside of the table;
including the index in the structured data;
replacing the attribute names and attribute values in the elements outside of the table with references to the index; and
providing the compressed version of the structured data to a computing device, wherein the compressed version of the structured data is in a same format as the structured data.

2. The method of claim 1, wherein the structured data is in Extensible Markup Language (XML) format.

3. The method of claim 1, wherein the structured data is in the Javascript Object Notation (JSON) format.

4. The method of claim 1, wherein the attribute names and attribute values of a cell element correspond to at least one of: a cell position, a cell height, a cell width, a column index of a cell, a row index of a cell, or an alignment of a cell.

5. The method of claim 1, further comprising:
delimiting the ordered sets of attribute values using a delimiting character, and
representing an attribute value that has not been set for a cell element as consecutive delimiting characters in the ordered set of attribute values of the cell element.

6. The method of claim 1, further comprising:
identifying a most frequently used set of repeated attribute names and attribute values in the elements outside of the table;
using the most frequently used set of repeated attribute names and attribute values as a default entry in the index; and
removing the most frequently used set of repeated attribute names and attribute values from the elements outside of the table.

7. The method of claim 6, further comprising:
including a set of repeated attribute names and attribute values in the index based on the set being repeated in the structured data more than a threshold amount.

8. The method of claim 7, further comprising:
including an attribute name and attribute value in the index based on the attribute name and attribute value having a combined number of characters greater than a threshold character limit.

9. A system for semantically compressing structured data comprising a processing circuit configured to:
store the structured data, the structured data defining a table, wherein the table is fully represented using text and includes one or more cell elements, each cell element having a set of attribute names and attribute values that define the layout of a table cell and the structured data further comprises elements outside of the table having attribute names and attribute values;
analyze the structured data to identify the attribute names and attribute values in the cell elements;
group the attribute names into an ordered set of cell attributes and assign a name to the ordered set of cell attributes;
generate an ordered set of attribute values for each of the one or more cell elements, wherein the ordered set of attribute values includes a single attribute and the attribute values and corresponds to the ordered set of cell attributes in the grouping having the assigned name;
add the ordered grouping of attribute names having the assigned name to the structured data;
replace the attribute names and attribute values of the cell elements in the structured data with the ordered sets of attribute values that includes the single attribute and the attribute values to generate a compressed version of the structured data;
identify repeated attribute names in the elements outside of the table;
generate an index of the repeated attribute names, each entry in the index corresponding to a set of attribute values for the elements outside of the table;
include the index in the structured data;
replace the attribute names and attribute values in the elements outside of the table with references to the index;
identify a most frequently used set of repeated attribute names and attribute values in the elements outside of the table; and
provide the compressed version of the structured data to a computing device, wherein the compressed version of the structured data is in a same format as the structured data.

10. The system of claim 9, wherein the structured data is in Extensible Markup Language (XML) format.

11. The system of claim 9, wherein the structured data is in the Javascript Object Notation (JSON) format.

12. The system of claim 9, wherein the attribute names and attribute values of a cell element correspond to at least one of: a cell position, a cell height, a cell width, a column index of a cell, a row index of a cell, or an alignment of a cell.

13. The system of claim 9, wherein the processing circuit is configured to delimit the ordered sets of attribute values using a delimiting character, and wherein the processing circuit is configured to represent an attribute value that has not been set for a cell element as consecutive delimiting characters in the ordered set of attribute values of the cell element.

14. The system of claim 9, wherein the processing circuit is configured to:
   identify a most frequently used set of repeated attribute names and attribute values in the elements outside of the table;
   use the most frequently used set of repeated attribute names and attribute values as a default entry in the index;
   include a set of repeated attribute names and attribute values in the index based on the set being repeated in the structured data more than a threshold amount;
   include an attribute name and attribute value in the index based on the attribute name and attribute value having a combined number of characters greater than a threshold character limit; and
   remove the most frequently used set of repeated attribute names and attribute values from the elements outside of the table.

15. The system of claim 14, wherein index is not statically defined and the processing circuit is configured to change the index at runtime.

* * * * *